United States Patent
Hsu et al.

(10) Patent No.: US 7,355,897 B2
(45) Date of Patent: *Apr. 8, 2008

(54) METHODS TO RESOLVE HARD-TO-ERASE CONDITION IN CHARGE TRAPPING NON-VOLATILE MEMORY

(75) Inventors: Tzu-Hsuan Hsu, Chiayi County (TW); Yen-Hao Shih, Banqiao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/773,857

(22) Filed: Jul. 5, 2007

(65) Prior Publication Data

US 2007/0253258 A1 Nov. 1, 2007

Related U.S. Application Data

(63) Continuation of application No. 11/359,044, filed on Feb. 22, 2006, now Pat. No. 7,242,622.

(60) Provisional application No. 60/742,713, filed on Dec. 6, 2005.

(51) Int. Cl.
*G11C 16/04* (2006.01)

(52) U.S. Cl. ............................. 365/185.29; 365/185.28; 365/185.3

(58) Field of Classification Search ........... 365/185.29, 365/185.3, 185.28, 185.18, 189.09
See application file for complete search history.

(56) References Cited

U.S. PATENT DOCUMENTS 5,270,969 A 12/1993 Iwahashi et al.
5,428,568 A 6/1995 Kobayashi et al.
5,448,517 A 9/1995 Iwahashi et al.
5,602,789 A 2/1997 Endoh et al.

(Continued)

FOREIGN PATENT DOCUMENTS

JP 09162313 6/1997

(Continued)

OTHER PUBLICATIONS

Bude, et al., "Secondary Electron Flash—a High Performance, Low Power Flash Technology for 0.35 um and Below" IEEE 1997, pp. 11.3.1-11.3.4.
Chang et al., "A New SONOS Memory Using Souce-Side Injection for Programming," IEEE Electron Device Letters, vol. 19, No. 7, Jul. 1998, pp. 253-255.
Lee et al., "A Novel SONOS Structure of SiO2/SiN/Al2O3 with TaN Metal Gate for Multi-Giga Bit Glash Memeries," IEEE 2003, 4 pages.

(Continued)

*Primary Examiner*—Gene N. Auduong
(74) *Attorney, Agent, or Firm*—Haynes Beffel & Wolfeld LLP

(57) ABSTRACT

A method for operating a nitride trapping memory cell is provided to resolve hard-to-erase condition by employing a reset technique to eliminate or reduce the number of electrons in the middle of a junction region. When a hard-to-erase condition is detected after a series of program and erase cycles, such as 500 or 100 program and erase cycles, a substrate transient hot hole (STHH) reset operation is applied. The substrate transient hot hole reset injects holes that are far away junction than band-to-band tunneling hot hole (BTBTHH) injection such that the STHH reset on cycle endurance is able to maintain a desirable cycle window to eliminate or reduce the hard-to erase condition in subsequent program and erase cycles.

9 Claims, 7 Drawing Sheets

U.S. PATENT DOCUMENTS

| | | |
|---|---|---|
| 5,694,356 A | 12/1997 | Wong et al. |
| RE35,838 E | 7/1998 | Momodomi et al. |
| 6,023,423 A | 2/2000 | Aritome et al. |
| 6,067,251 A | 5/2000 | Hirano et al. |
| 6,075,727 A | 6/2000 | Morton et al. |
| 6,215,148 B1 | 4/2001 | Eitan et al. |
| 6,363,013 B1 | 3/2002 | Lu et al. |
| 6,396,741 B1 | 5/2002 | Bloom et al. |
| 6,445,617 B1 | 9/2002 | Sakakibara et al. |
| 6,496,417 B1 | 12/2002 | Shiau et al. |
| 6,538,923 B1 | 3/2003 | Parker |
| 6,556,481 B1 | 4/2003 | Hsu et al. |
| 6,614,693 B1 * | 9/2003 | Lee et al. .............. 365/185.29 |
| 6,643,181 B2 | 11/2003 | Sofer et al. |
| 6,643,185 B1 | 11/2003 | Wang et al. |
| 6,657,894 B2 * | 12/2003 | Yeh et al. .............. 365/185.16 |
| 6,683,811 B2 | 1/2004 | Ishii et al. |
| 6,690,601 B2 | 2/2004 | Yeh et al. |
| 6,714,457 B1 | 3/2004 | Hsu et al. |
| 6,721,204 B1 | 4/2004 | Yeh et al. |
| 6,829,175 B2 | 12/2004 | Tsai et al. |
| 6,834,012 B1 | 12/2004 | He et al. |
| 6,836,435 B2 | 12/2004 | Li |
| 6,937,511 B2 | 8/2005 | Hsu et al. |
| 6,977,843 B2 * | 12/2005 | Hamaguchi et al. ... 365/185.18 |
| 7,133,317 B2 * | 11/2006 | Liao et al. ............. 365/185.28 |
| 7,164,603 B2 * | 1/2007 | Shih et al. ............. 365/185.18 |
| 2004/0084714 A1 | 5/2004 | Ishii et al. |
| 2004/0145024 A1 | 7/2004 | Chen et al. |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0281085 A1 | 12/2005 | Wu |
| 2006/0039219 A1 | 2/2006 | Sofer et al. |
| 2006/0044934 A1 | 3/2006 | Wong et al. |
| 2006/0050562 A1 | 3/2006 | Cernea et al. |
| 2006/0198190 A1 * | 9/2006 | Lue ....................... 365/185.12 |

FOREIGN PATENT DOCUMENTS

| | | |
|---|---|---|
| JP | 11233653 | 8/1999 |
| WO | WO-9428551 | 12/1994 |

OTHER PUBLICATIONS

Liu et al., "A New Programming Technique for Flash Memory Devices," International Symposium on VLSI Technology, Systems and Applications, Jun. 8-10, 1999, pp. 195-198.

Yeh et al., "Novel Operation Schemes to Improve Device Reliability in a Localized Trapping Storage SONOS-type Flash Memory," IEEE 2003, pp. 7.5.1-7.5.4.

Sim et al., "BAVI-Cell: A Novel High-Speed 50 nm SONOS Memory with Band-to-Band Tunneling Initiated Avalanche Injection Mechanism," 2005 Symp. on VLSI Tech Digest of Tech Papers, 122-123.

Shih et al., A Novel 2bit/cell Nitride Storage Flash memory with Greater Than 1M P/E-cycle Endurance, IEEE 2004, pp. 36.3.1-36.3.4.

Cho et al. "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, pp. 260-262.

* cited by examiner

METHODS TO RESOLVE HARD-TO-ERASE CONDITION IN CHARGE TRAPPING NON-VOLATILE MEMORY

RELATED APPLICATION DATA

This application is a continuation of U.S. patent application Ser. No. 11/359,044 entitled "METHODS TO RESOLVE HARD-TO-ERASE CONTINION IN CHARGE TRAPPING NON-VOLATILE MEMORY" filed on 22 Feb. 2006, now U.S. Pat. No. 7,242,622, which application claims the benefit of U.S. Provisional Patent Application No. 60/742,713, entitled METHODS TO RESOLVE HARD-TO-ERASE CONDITION IN CHARGE TRAPPING NON-VOLATILE MEMORY, filed 06 Dec. 2005.

BACKGROUND OF THE INVENTION

1. Field of the Invention

The present invention relates generally to electrically programmable and erasable memory, and more particularly, to resolve hard-to-erase condition under high cycle endurance in charge trapping memory.

2. Description of Related Art

Electrically programmable and erasable non-volatile memory technologies based on charge storage structures known as Electrically Erasable Programmable Read-Only Memory (EEPROM) and flash memory are used in a variety of modem applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names Nitride Read-Only Memory (NROM), SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

NROM devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an NROM flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

A typical flash memory cell structure positions a tunnel oxide layer between a conducting polysilicon tunnel oxide layer and a crystalline silicon semiconductor substrate. The substrate refers to a source region and a drain region separated by an underlying channel region. A flash memory read can be executed by a drain sensing or a source sensing. For source side sensing, one or more source lines are coupled to source regions of memory cells for reading current from a particular memory cell in a memory array.

A traditional floating gate device stores 1 bit of charge in a conductive floating gate. The advent of NROM cells in which each NORM cell provides 2 bits of flash cells that store charge in an Oxide-Nitride-Oxide (ONO) dielectric. In a typical structure of a NROM memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side of a NROM cell.

A frequently used technique to program NROM cells in an NROM array is the hot electron injection method. During a erase operation, a common technique used to erase memory cells is called the band-to-band tunneling hot hole injection where the erase ability is highly dependent on the lateral electric field. The other side potential, from the side that is being erased, of a NROM cell is likely to have a lateral electric field effect on the erase ability. Evaluating the endurance and retention of a NROM array, the lack of uniformity in erase ability causes a margin loss due to cycling and baking. The other side of NROM cells are left floating (or connected to ground) which may be coupled to an uncertain voltage level (e.g. 1 volt or 4 volts), which causes an variation of the erase threshold of array cells. This in turn causes Vt distribution after an erase operation to be wider.

A NROM type of device typically undergoes a series of program and erase cycles which causes electrons to migrate closer to the middle of a channel region. In a subsequent erase operation using a technique such as BTBTHH, it would be difficult to move holes toward the middle of the channel region which makes the residual electrons located near the channel region hard to erase. The hard to erase scenario typically occurs in a multi-bit cell like NROM with localized hot electron and hot hole injection program and erase schemes.

A typical spatial distribution in a charge trapping memory is that electrons and holes tend localized. It is frequently the case that the electron distribution may not match the hole distribution, which results in a threshold voltage Vt that trends upward after every program/erase cycle that leaves some electrons in the channel region of an oxide-nitride-oxide structure. Consequently, the threshold voltage Vt window between a programming event and an erase event becomes narrower under high cycle endurance, as the electron accumulations become worse. This phenomenon is commonly referred to "hard-to-erase" condition. A hard-to-erase condition cannot be easily resolved by band-to-band tunneling hot hole erase because hole injection has a tight spatial distribution.

Accordingly, it is desirable to design a method to resolve hard-to-erase scenario in nitride trapping memory to overcome the mismatch of electron and hole injections that occurs after a number of program and erase cycles.

SUMMARY OF THE INVENTION

A method for operating a nitride trapping memory cell is provided to resolve hard-to-erase condition by employing a reset technique to eliminate or reduce the number of electrons in the middle of a junction region. When a hard-to-erase condition is detected after a series of program and erase cycles, such as 500 or 100 program and erase cycles, a substrate transient hot hole (STHH) reset operation is applied. The substrate transient hot hole reset injects holes that are far away junction than band-to-band tunneling hot hole (BTBTHH) injection such that the STHH reset on cycle endurance is able to maintain a desirable cycle window to eliminate or reduce the hard-to erase condition in subsequent program and erase cycles.

Broadly stated, a method for resolving a hard-to-erase condition in a charge trapping memory, the charge trapping memory having a gate voltage and a body voltage comprises responding to the presence of a condition after a plurality of program and erase cycles in the charge trapping memory for performing a substrate transient hot hole reset; and performing the substrate transient hot hole reset by setting a voltage threshold of the charge trapping memory equal to a reset voltage, the substrate transient hot hole reset including: applying a gate voltage having a pulse width; and applying a body voltage having a pulse width that is shorter than the pulse width of the gate voltage; and wherein the difference in the pulse width of the gate voltage and the pulse width of the body voltage is sufficient to move holes from a channel area to the charge trapping memory.

A method for resolving a hard-to-erase condition in a charge trapping memory, the charge trapping memory having a gate voltage and a body voltage, comprises determining the presence of a condition for a substrate transient hot hole reset after a plurality of program and erase cycles in the charge trapping memory; and performing the substrate transient hot hole reset by setting a voltage threshold of the charge trapping memory equal to a reset voltage, the substrate transient hot hole reset including: resetting a gate voltage having a long bias pulse width; resetting a body voltage having a short bias pulse width relative to the long pulse width of the gate voltage; and producing a collection time sufficient to move holes from a channel area to the charge trapping memory; wherein the collection time is a time differential between the long bias pulse width of the gate voltage and the short bias pulse width of the body voltage.

Advantageously, the present invention provides methods that resolve hard-to-erase conditions by two-side operations with localized charge storage. The present invention also advantageously produces smaller erase degradation by substrate transient hot hole reset so that the retention quality can be improved with less hot hole damage.

The structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

DETAILED DESCRIPTION

Figure 1:
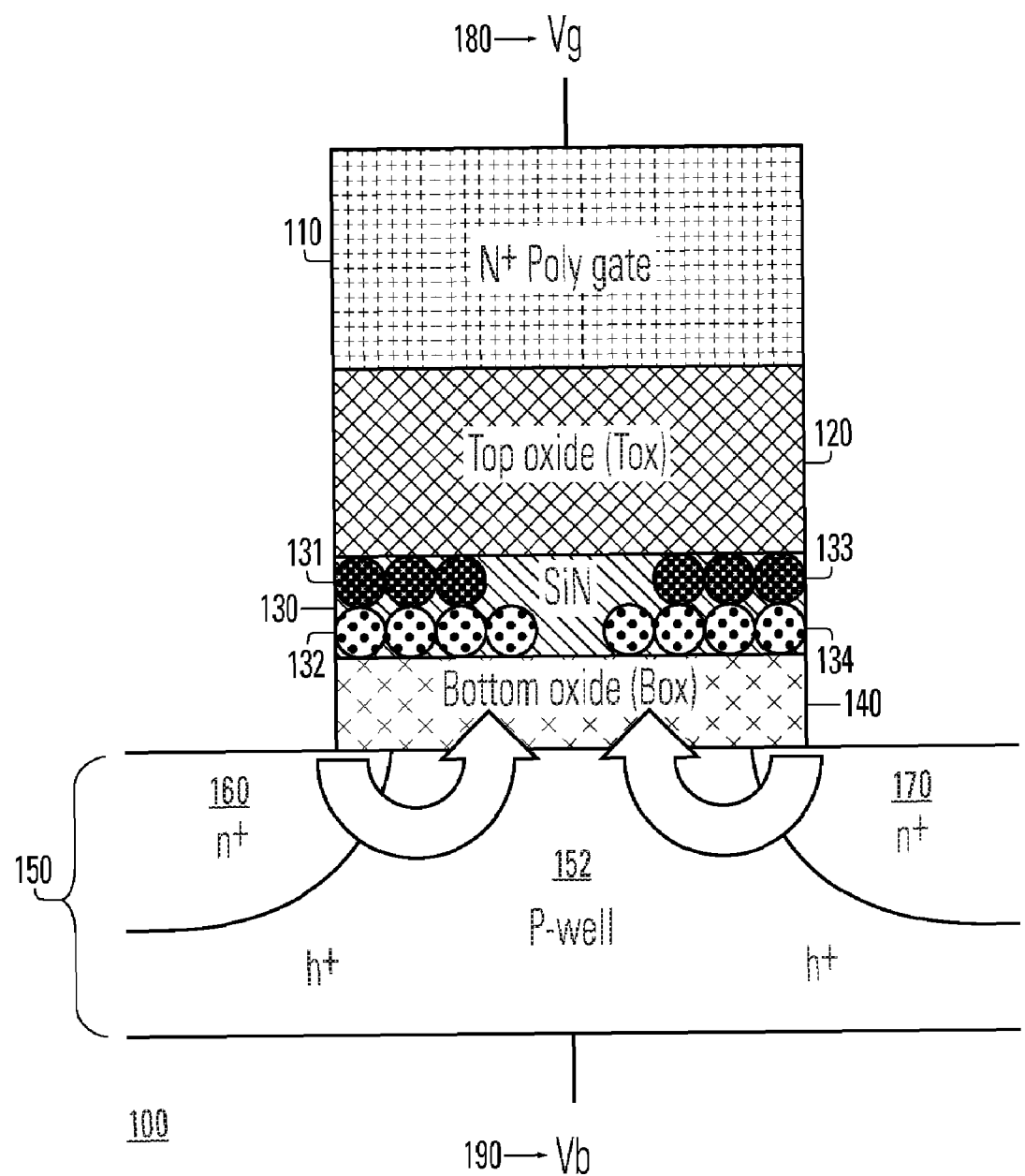
FIG. 1 is a simplified structural diagram illustrating a charge trapping memory with a substrate transient hot hole reset in accordance with the present invention.

Referring now to FIG. 1, there is shown a simplified structural diagram illustrating a charge trapping memory 100 for carrying out a reset operation using a substrate transient hot hole reset (STHH) operation. The charge trapping memory cell 100 has a substrate 150 with n+ doped regions 160 and 170, and a p-doped region 152 between the n+ doped regions 160 and 170. A bottom dielectric structure 140 (bottom oxide) overlays the substrate 150, a charge trapping structure 130 (e.g. silicon nitride layer) overlays the bottom dielectric structure 140, and a top dielectric structure (top oxide) 120 overlays the charge trapping structure 130, and a N+ poly gate 110 overlays the top dielectric structure 120. A gate voltage 180, Vg, is applied to the n+ poly gate 110, and a body voltage 190, Vb, is applied to the P-well substrate 150. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, $CeO_2$, and others. The charge trapping structure may be a discontinuous set of pockets or particles of charge trapping material, or a continuous layer as shown in the drawing. The charge trapping structure 130 has trapped charge such as represented by electrons 131 and 133.

Electrons 131 and 133 are injected into the charge trapping structure 130 during a program cycle. A substrate transient hot hole reset causes holes that can be gathered from the center of the channel to an edge and enter the bottom dielectric structure 140 and into the charge trapping structure 130, as shown with holes 132 and 134. In a prior erase solution such as band-to-band hot-hole erase, holes are typically applied to n+ regions 160 and 170. In one embodiment, the gate voltage Vg 180 is set to −3 volts, the body voltage Vb is set to 8 volts, and source and drain voltages are left floating.

The memory cell for NROM-like cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

The magnitude of the gate-to-substrate bias according to embodiments of a charge balancing pulse is determined with reference to the effective oxide thickness EOT of the dielectric stack, including the top dielectric, the charge trapping structure and the bottom dielectric, when the EOT is the actual thickness as normalized with respect to the permittivity of silicon dioxide. For example, when the top dielectric, charge trapping structure and bottom dielectric comprise silicon dioxide, silicon nitride and silicon dioxide, respectively, the structure is referred to as an ONO stack. For an ONO stack, the EOT is equal to the top oxide thickness, plus the bottom oxide thickness plus the nitride thickness times the oxide permittivity divided by nitride permittivity. Now, the bias arrangement for a charge balancing pulse can be defined for NROM-like and SONOS-like memory cells as follows:

1. NROM-like memory cells for the purpose of this description are cells that have a bottom oxide thickness >3 nm. The dielectric stack has an EOT (10 nm to 25 nm, for example), and the bottom oxide is thicker than 3 nm to prevent direct tunneling of holes from the substrate, and the gate to the substrate bias has a voltage (−5 volts to −24 volts for example), and the voltage divided by EOT is greater than 0.7 V/nm, and preferably about 1.0 V/nm, plus or minus about 10%.

EOT Calculation for ONO in NROM-like cell:

|  | MIN | MAX |
|---|---|---|
| Top OX (permittivity = 3.9) | 5 nm | 10 nm |
| SIN (permittivity = 7) | 3 nm | 9 nm |
| Bottom OX (permittivity = 3.9) | 3 nm | 10 nm |
| SUM | 5 + 3 * 3.9/ 7 + 3 = 10(nm) | 10 + 9 * 3.9/ 7 + 10 = 25 nm |

2. SONOS-like memory cells for the purpose of this description are cells that have a bottom oxide thickness <3 nm. The dielectric stack has an EOT (5 nm to 16 nm, for example), and the bottom oxide is thinner than 3 nm, allowing direct tunneling of holes from substrate. The gate to the substrate bias for SONOS-like cells has a voltage (−5 volts to −24 volts for example), and that voltage divided by the EOT is greater than 0.3 V/nm, and preferably about 1.0 V/nm, plus or minus about 10%. The operation bias of gate to substrate is substantially the same or the same in NROM-like or SONOS-like memory. However, the voltage divided on the EOT depends on different EOT on NROM-like and SONOS-like memory.

EOT Calculation for ONO in SONOS-like cell:

|  | MIN | MAX |
|---|---|---|
| Top OX (permittivity = 3.9) | 3 nm | 10 nm |
| SIN (permittivity = 7) | 3 nm | 5 nm |
| Bottom OX (permittivity = 3.9) | 1 nm | 3 nm |
| SUM | 3 + 3 * 3.9/ 7 + 1 = 5.7(nm) | 10 + 5 * 3.9/ 7 + 3 = 15.8 nm |

For materials other than silicon dioxide and silicon nitride in the stack, the EOT is calculated in the same way, normalizing the thickness of the material by a factor of the permittivity of silicon dioxide divided by the permittivity of the material.

Figure 2:
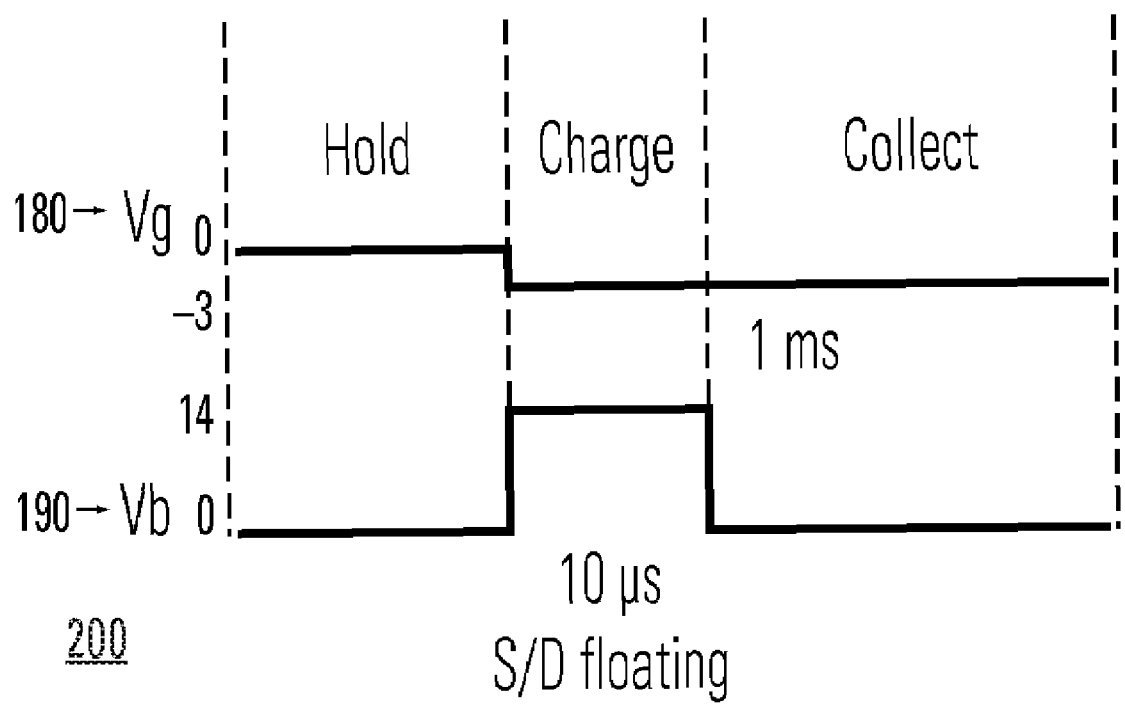
FIG. 2 is a timing diagram illustrating a waveform for the Vg bias voltage relative to the Vb bias voltage in accordance with the present invention.

A timing diagram illustrating the timing relationship between the gate bias voltage Vg 180 and the body bias voltage Vb 190 is shown in FIG. 2. The body bias voltage Vb 190 can induce transient current that is collected by the gate bias voltage Vg 180. The gate bias voltage Vg 180 has a bias pulse width that is longer than a bias pulse width of the body bias voltage Vb 190. When the gate bias voltage Vg changes from a hold state to a charge state, the pulse width of the gate bias voltage Vg extends for a longer period of time than when the body bias voltage Vb 190 changes from a hold state to a charge state. In this example, the pulse width of the charge time for the body bias voltage Vb 190 is 10 µs, which overlaps with the pulse width of the charge time for the gate bias voltage Vg 180. The overlapping of the charge time between the gate bias voltage Vg 180 at −3 volts and the body bias voltage Vg 190 at 8 volts creates the occurrence of the substrate transient hot hole reset, where the holes from the channel migrates toward the middle, entering the bottom dielectric structure 140, and into the charge trapping structure 130 due to the voltage differential between the body bias voltage Vb 190 and the gate bias voltage Vg 180. Because the body bias voltage Vb 190 has a higher voltage potential than the gate bias voltage 180, the holes moves from the channel, through the bottom oxide 140, and into the charge trapping layer 130.

The pulse width of the charge time for the gate bias voltage Vg 180 is longer than the pulse width of the charge time for the body bias voltage 190 so that there is a collection duration period after the overlapping of the charge time of 10 µs between the gate bias voltage Vg 180 and the body bias voltage Vb 190. The collection time in this example is approximately 1 ms, which is the amount of time that is necessary for the holes to move and travel from the channel, through the bottom dielectric structure 140, and into the charge trapping structure 130.

Figure 3:
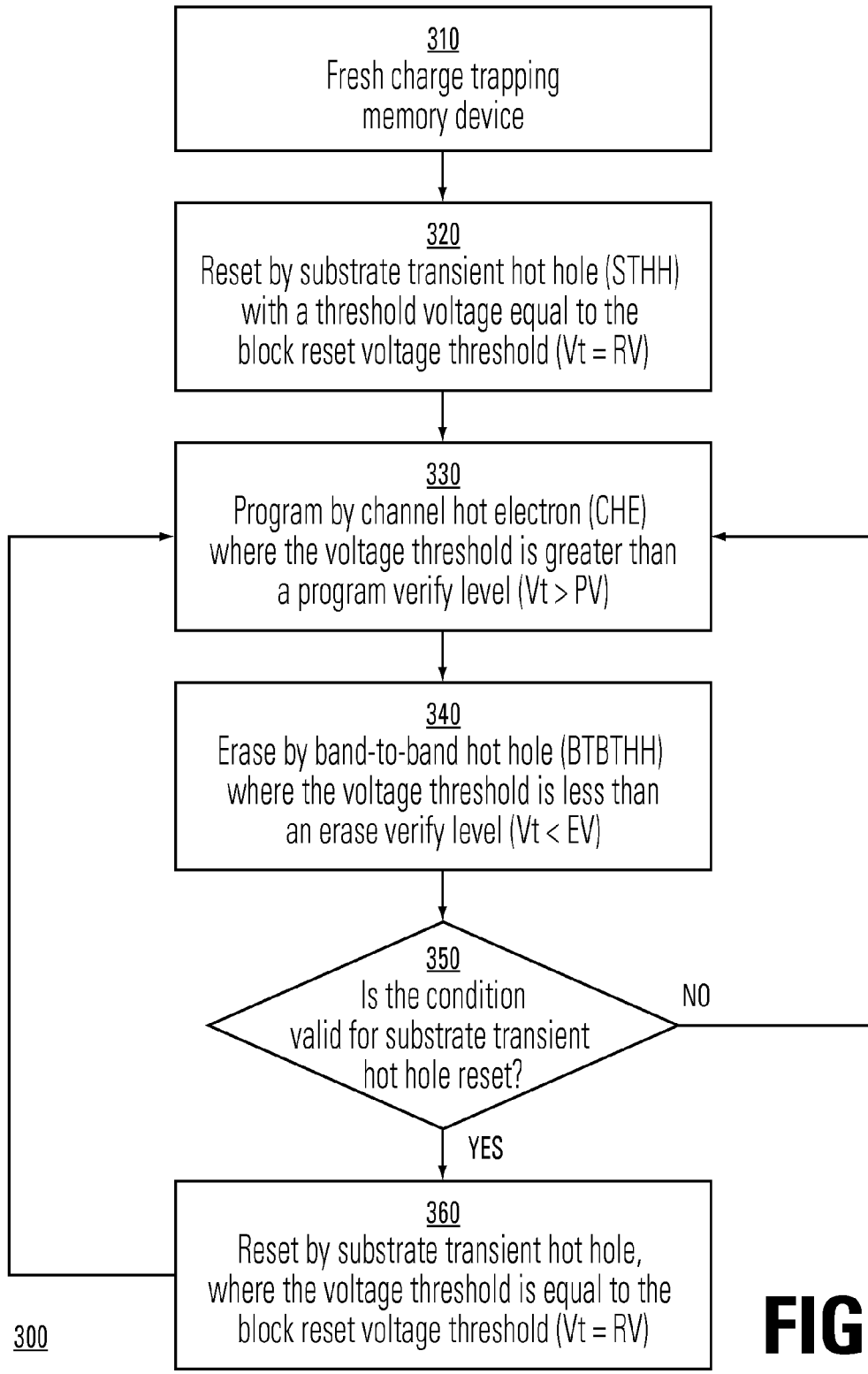
FIG. 3 is a simplified flow chart illustrating the process for executing a substrate transient hot hole reset in accordance with the present invention.

Turning now to FIG. 3, there is shown a simplified flow chart illustrating the process 300 for executing a substrate transient hot hole reset. At step 310, a fresh nitride memory device, such as the charge trapping memory 100, is provided for programming and erasing. At step 320, the fresh charge trapping memory 100 is reset by using substrate transient hot hole technique where the threshold voltage is set to equal to a block reset voltage threshold (Vt=RV). The process 300 programs the charge trapping memory 100 by channel hot electron (CHE) in which the voltage threshold is a value that is greater than a program verify level (Vt>PV). At step 340, the process 300 erases the charge trapping memory 100 by using band-to-band tunneling hot hole where the voltage threshold is a value that is less than an erase verify level (Vt<Ev). At step 350, the process detects whether the nitride memory device 100 is at a state which meets the condition sets forth to perform the substrate transient hot hole reset. If the state of the charge trapping memory 100 does not meet the condition of a substrate transient hot hole reset, the process 300 returns to step 330 to continue programming at step 330 and erasing at step 340 of the charge trapping memory 100. However, if the state of the nitride memory device 100 meets the condition of the substrate transient hot hole reset, meaning that a hard-to-erase condition has been detected in the charge trapping memory 100, the process 300 resets the charge trapping memory 100 by using the substrate transient hot hole reset technique, where the voltage threshold is set to equal to the a block reset voltage threshold (Vt=RV).

In an alternative embodiment at step 350, the charge trapping memory 100 can be periodically reset after a predetermined number of cycles, e.g. 500 or 1000 times P/E cycles. In a further embodiment, the process 500 can verify if the erase voltage state is at a predetermined voltage, e.g. 200 mV, higher than a designed erase voltage, then the nitride memory device 100 is reset using the substrate transient hot hole reset technique. In another embodiment, the substrate transient hot hole reset method can be applied as an erase technique during typical program and erase cycles.

Figure 4:
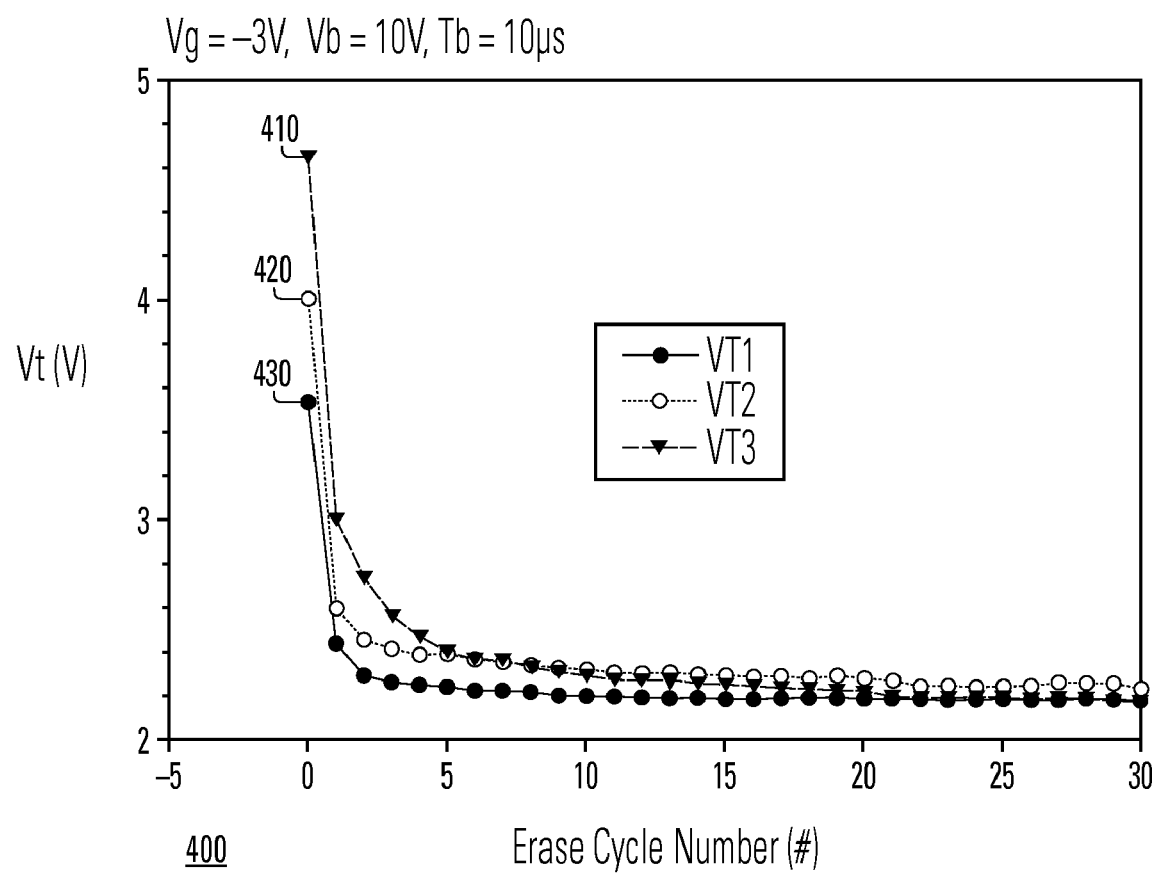
FIG. 4 is a graphical diagram illustrating the convergence of various voltage thresholds to a particular voltage in accordance with the present invention.

In FIG. 4, there is shown a graphical diagram 400 illustrating the convergence of various voltage thresholds to a particular voltage. The x-axis in the graph 400 represents the voltage level and the y-axis in the graph 400 represents the number of erase cycles. In the graph 400, three sample voltage thresholds, Vt1 410, 420 Vt2, and Vt3 430 are illustrated in which each threshold voltage begins at a different voltage level. The first voltage threshold Vt1 410 starts about 3.5 volts, the second voltage threshold Vt2 420 starts about 4.0 volts, and the third voltage threshold Vt3 430 starts about 4.6 volts. Eventually, the three voltage thresholds Vt1 410, Vt2 420, and Vt3 430, converge to about the same voltage level of about 2.2 volts. The self-convergence effect of the various threshold voltages means that the charge trapping memory 100 will be reset to the same voltage level under certain substrate transient hot hole bias.

Figure 5:
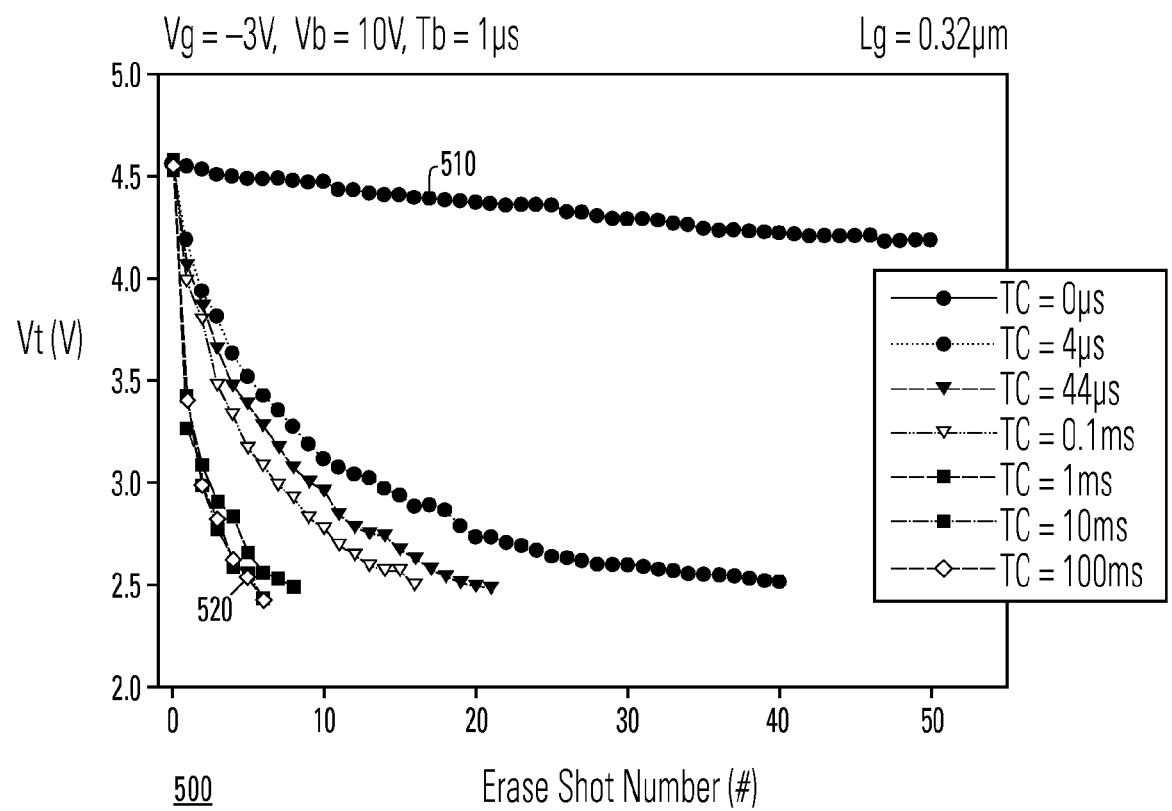
FIG. 5 is a graphical diagram illustrating the amount of collection time necessary for the substrate transient hot hole reset operation in accordance with the present invention.

FIG. 5 is a graphical diagram 500 illustrating the amount of collection time necessary to carry out a substrate transient hot hole reset. The x-axis in the graph 500 represents the voltage level and the y-axis in the graph 500 represents the number of erase shots. Several different durations of a collection time is illustrated in the graph 500 which shows the effect of a curve 510 with a zero collection time in which there is little change in the voltage threshold level, to a curve 520 with a 100 ms collection time in which there is a significant drop in the voltage threshold level. The collection time, as also describe above, represents the amount of time that is necessary for the holes to move and travel from the channel, through the bottom dielectric structure 140, and into the charge trapping layer 130.

Figure 6A:
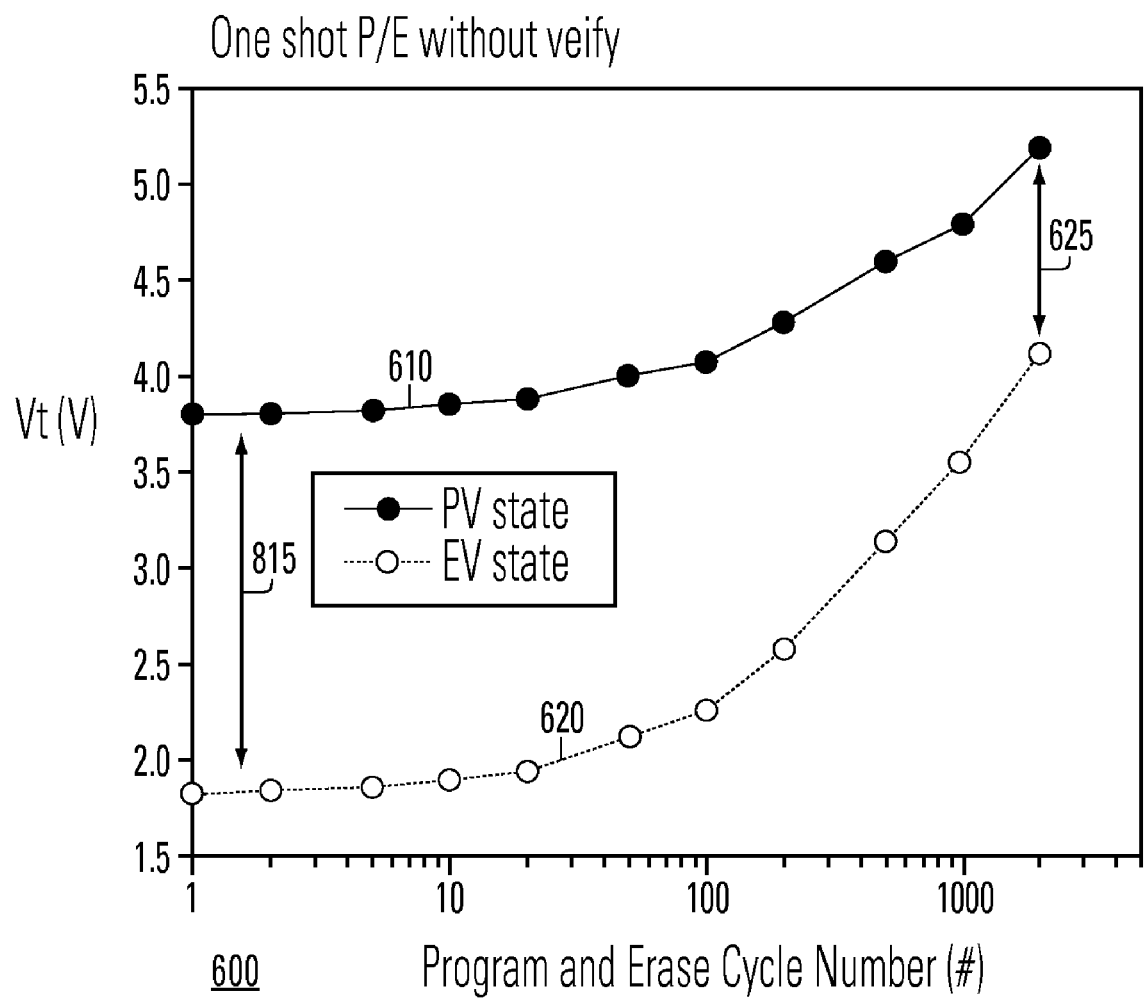
FIG. 6A is a prior art graphical diagram illustrating sample curve characteristics with a first curve representing program voltage states and a second curve representing erase voltage states in accordance with the present invention.

As shown in FIG. 6A, there is a conventional graphical diagram 600 illustrating sample curve characteristics with a first curve 610 representing program voltage (PV) states and a second curve 620 representing erase voltage (EV) states. In the sample graphical diagram 600, the first curve 610 representing program voltage states begins with a starting program voltage of around 3.8 volts while the second curve 620 representing erase voltage states begins around 1.8 volts. A cycle window 615 between the starting program voltage in the first curve 610 and the starting erase voltage in the second curve 620 is approximately 3.0 volts. As the number of program and erase cycles occurs over the time, the cycle window between the first curve 610 and the second curve 620 becomes narrower as a function of time. The increase in the erase voltage states in the second curve 620 is attributed to the electrons that gathered in the middle of the junction region in the charge trapping memory 100. For example, after 1000 program and erase cycles, the program voltage in the first curve 610 is approximately 4.7 volts while the erase voltage in the second curve 620 is approximately 3.3 volts, which produces a cycle window 625 of about 1.5 volts. A sufficient gap between the program voltage state and the erase voltage state is necessary, e.g. 1.8 volts, for a charge trapping memory to operate properly.

Figure 6B:
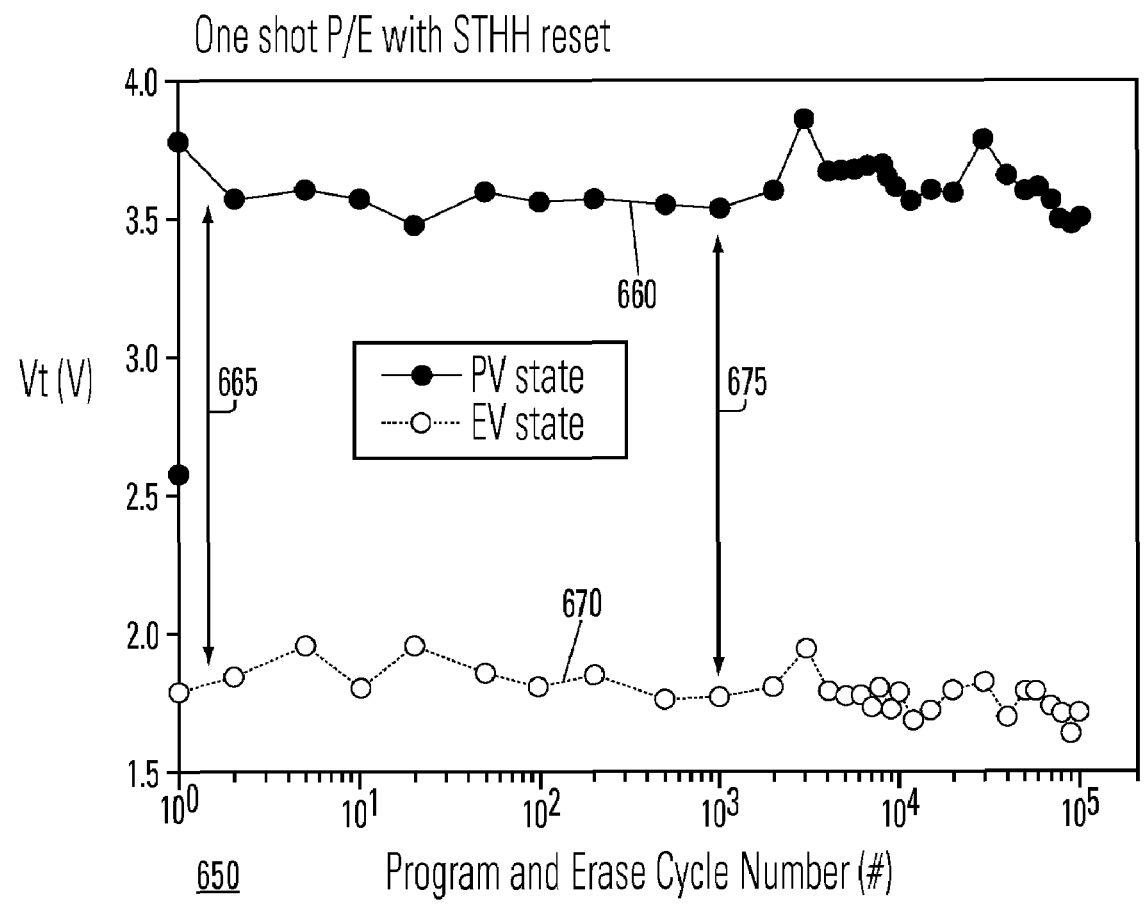
FIG. 6B is a graphical diagram illustrating sample curve characteristics with a first curve representing program voltage states and a second curve representing erase voltage states with a substrate transient hot hole reset in accordance with the present invention.

In a further illustration in FIG. 6B, there is a graphical diagram 650 illustrating sample curve characteristics with a first curve 660 representing program voltage states and a second curve 670 representing erase voltage states with a substrate transient hot hole reset. The substrate transient hot hole reset resolves the hard-to-erase condition so that the window cycle between the program voltage state 660 and the erase voltage state 670 remains sufficiently apart for the charge trapping memory 100 to operate normally. In the sample graphical diagram 650, the first curve 660 representing program voltage states begins with a starting program voltage of around 3.8 volts while the second curve 670 representing erase voltage states begins around 1.8 volts. A cycle window 665 between the starting program voltage in the first curve 660 and the starting erase voltage in the second curve 670 is approximately 3.0 volts. Even after hundreds of program and erase cycles, the second curve 670 representing the erase voltage states remain substantially unchanged. For example, after 1000 program and erase cycles, the program voltage in the first curve 660 is approximately 3.8 volts while the erase voltage in the second curve 670 is approximately 1.8 volts, which produces a cycle window 675 of about 1.8 volts.

The invention has been described with reference to specific exemplary embodiments. For example, the method in the present invention is applicable to any types or variations of a nitride trapping memory including both N-channel and P-channel SONOS type of devices and floating gate memory. Furthermore, although the above illustrate describe a channel hot electron program with band-to-band tunneling hot hole erase, the substrate transient hot hole reset method is also applicable with other program techniques including source side injection (SSI), pulse agitated substrate hot electron injection (PASHEI) or channel initiated secondary electron (CHISEL), accompanied with band to band hot hole tunneling hot hole erase operation on two bits operation in the nitride trapping memory. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. An integrated circuit device comprising:
   a plurality of memory cells on a substrate, each memory cell of the plurality of memory cells having a threshold voltage, a erase verified level and comprising:
   a body with a channel area;
   a charge trapping layer adjacent to the body, a gate adjacent to the charge trapping layer against the body, a gate voltage line connected to the gate;

a body voltage line connected to the body; and circuitry by which the gate is applied with a gate voltage pulse, the body is applied with a body voltage pulse, and wherein the gate voltage pulse is continued to apply to the gate to adjust the threshold voltage less than the erase verified level after the body voltage pulse ends.

2. The integrated circuit device of claim 1, wherein the charge trapping layer comprises a high dielectric constant material that is sufficient to serve as a charge storage layer.

3. The integrated circuit device of claim 2, wherein the high dielectric constant material comprises Aluminum oxide, Hafnium Oxide, or Cerium Oxide.

4. A operating method of a memory cell having a threshold voltage, a erase verified level, a body with a channel area, a charge trapping layer, and a gate on a substrate, comprising:

applying a gate voltage pulse with a first width to the gate;

applying a body voltage pulse with a second width to the body; and wherein the gate voltage pulse is continued to apply to the gate to adjust the threshold voltage less than the erase verified level after the body voltage pulse ends.

5. The method of claim 4, wherein the first pulse width is 1 ms, and the second pulse width is 10 μs.

6. The method of claim 4, wherein the threshold voltage is adjusted to less than the erase verified level by a substrate transient hot hole method.

7. The method of claim 4, wherein the threshold voltage is adjusted to less than the erase verified level by a band-to-band tunneling hot hole method.

8. A method for resolving a hard-to-erase condition in a charge trapping memory, the charge trapping memory having a gate voltage and a body voltage, comprising:

responding to the presence of a condition after a plurality of program and erase cycles in the charge trapping memory for performing a substrate transient hot hole reset; and performing the substrate transient hot hole reset by inducing hole tunneling from the channel to achieve a voltage threshold of the charge trapping memory equal to a reset voltage.

9. The method of claim 8 wherein the substrate transient hot hole reset comprises:

applying a gate voltage having a pulse width; and applying a body voltage having a pulse width that is shorter than the pulse width of the gate voltage;

wherein the difference in the pulse width of the gate voltage and the pulse width of the body voltage is sufficient to move holes from a channel area to the charge trapping layer.

* * * * *